(12) United States Patent
D'Inca et al.

(10) Patent No.: US 10,910,766 B2
(45) Date of Patent: Feb. 2, 2021

(54) CONNECTOR SYSTEM

(71) Applicant: Telefonaktiebolaget LM Ericsson (publ), Stockholm (SE)

(72) Inventors: Claudio D'Inca, Genoa (IT); Sergio Lanzone, Genoa (IT); Marco Assale, Genoa (IT); Sergio Mosti, Genoa (IT); Angelo Rivara, Genoa (IT)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 16/419,655

(22) Filed: May 22, 2019

(65) Prior Publication Data

US 2019/0273340 A1 Sep. 5, 2019

Related U.S. Application Data

(63) Continuation-in-part of application No. 16/349,126, filed as application No. PCT/EP2016/079639 on Dec. 2, 2016, now Pat. No. 10,777,939.

(51) Int. Cl.
| | |
|---|---|
| *H01R 13/631* | (2006.01) |
| *H01R 12/72* | (2011.01) |
| *G02B 6/42* | (2006.01) |
| *H01L 35/28* | (2006.01) |

(52) U.S. Cl.
CPC ......... *H01R 13/631* (2013.01); *G02B 6/4261* (2013.01); *G02B 6/4269* (2013.01); *G02B 6/4271* (2013.01); *H01L 35/28* (2013.01); *H01R 12/722* (2013.01)

(58) Field of Classification Search
CPC ............... F21V 29/004; F21V 201/12; H01R 13/6581–6597; H01R 13/631; H01R 12/722; G02B 6/4261; G02B 6/4271; G02B 6/4269; H01L 35/28
USPC ................................ 439/487, 607.2, 607.21
See application file for complete search history.

(56) References Cited

U.S. PATENT DOCUMENTS

| | | | |
|---|---|---|---|
| 4,935,864 A | * | 6/1990 | Schmidt .................. H01L 23/38 257/467 |
| 7,224,582 B1 | | 5/2007 | Saturley et al. |
| 2012/0168122 A1 | | 7/2012 | Skepnek et al. |
| 2015/0029667 A1 | | 1/2015 | Szczesny |
| 2015/0296638 A1 | | 10/2015 | Wu et al. |

OTHER PUBLICATIONS

International Search Report and Written Opinion dated Aug. 22, 2017 for International Application No. PCT/EP2016/079639 filed on Dec. 2, 2016, consisting of 14-pages.

* cited by examiner

*Primary Examiner* — Gary F Paumen
(74) *Attorney, Agent, or Firm* — Christopher & Weisberg, P.A.

(57) ABSTRACT

There is provided an interface module, having an interface for connection with a signal connector, a cage for guiding the signal connector towards the interface and a heat sink. The cage includes a cage portion that is configured to move from a first position to a second position upon insertion of the signal connector into the cage. In the first position, the cage portion is not in thermal contact with the heat sink. When in the second position, the cage portion is in thermal contact with the heat sink.

17 Claims, 5 Drawing Sheets

CONNECTOR SYSTEM

CROSS-REFERENCE TO RELATED APPLICATIONS

This application is a Continuation-in-Part of U.S. application Ser. No. 16/349,126 filed on May 5, 2019, which is a U.S. National Stage of International Application No. PCT/EP2016/079639, filed on Dec. 2, 2016, the entireties of both of which are incorporated herein by reference.

TECHNICAL FIELD

The present disclosure relates to the field of connectors, such as electrical or optical connectors, and particularly to connectors requiring a heat sink.

BACKGROUND

Typical connector systems include a cable assembly and a connector mounted on a board such as a printed circuit board (PCB). The cable assembly, which commonly includes a pair of plug connectors on opposite ends of a cable, is configured to transmit signals over a certain distance. The board-mounted connector may comprise a receptacle, or cage, configured to receive and mate with one of the plug connectors, ensuring a secure connection between the cable assembly and an interface on the board. A signal (such as an electrical or optical signal) may thus be received at the interface via the cable, or transmitted from the interface via the cable.

One issue that has arisen in the development of such connector systems is the build-up of heat in and around the receptacle. This problem is particularly pronounced for active cable assemblies (i.e. cables having embedded circuitry to boost their performance). In order to address this problem, heat sinks have been used to dissipate the heat that builds up in the connector.

FIG. 1 is a schematic diagram of a conventional interface module 100, shown in cross section. The interface module 100 may be suitable for use in a larger apparatus, such as a computer system, a server, or another network component, for inputting or outputting signals via an electrical or optical cable assembly.

The module 100 comprises a housing 102, which substantially encloses and surrounds the internal components of the module 100. A PCB 104 is fixed to one internal surface of the housing 102, and a cage or receptacle 106 is fixed to the PCB 104. The cage 106 is hollow, and comprises an opening, a rear face opposite the opening, and a main body extending between the opening and the rear face. The opening is aligned with a corresponding opening in the housing 102, such that a connector (e.g. a connector for a cable assembly) can be inserted through the opening, and is guided towards the rear of the cage by the main body. The cage 106 may define an internal space or bore, having a cross section that complements the cross section of the connector, so as to guide the connector accurately to an interface 108 that is positioned towards the rear of the cage 106. When the connector is fully inserted in the cage 106, it mates with the interface 108 such that signals can pass from the connector to the PCB 104 via the interface 108, or from the PCB 104 to the connector via the interface 108.

In order to dissipate excess heat that may build up in the connector while in use, the module 100 further comprises a heat sink 110 that extends over an upper surface of the cage 106. In the illustration the heat sink 110 is supported by the PCB 104, but alternatively the heat sink 110 may be coupled to an internal surface of the module 100 or some other structure within the module 100. The heat sink 110 may be manufactured from a material having a high thermal conductivity, and comprise one or more fins or other features designed to dissipate heat.

One factor that affects the efficiency of the heat sink is its thermal interface with the heat source, i.e. the connector. In order to improve the thermal interface between the heat sink and the connector, the cage 106 may comprise one or more apertures 112 through which the heat sink 110 can be coupled directly to the connector. For example, FIG. 1 shows a single, large aperture 112 in the upper surface of the cage 106. The heat sink 110 may comprise one or more corresponding features that extend through the aperture to engage with the connector once it is inserted into the cage 106. One or more spring clips may be used to hold and press the heat sink 110 and the cage 106 together, to increase the thermal contact between the heat sink 110 and the connector.

However, there are a number of problems with the arrangement shown in FIG. 1. One problem is the number of components required to achieve an adequate thermal connection between the connector and the heat sink. For example, spring clips may be required to press the heat sink 110 and the cage 106 together. Such clips may be difficult to handle, even in automated manufacturing systems. Further, the heat sink 110 itself is a large component that takes up a considerable volume within the interface module 100.

A connector system is required that addresses one or more of these problems.

SUMMARY

One aspect of the present disclosure provides an interface module, comprising: an interface for connection with a signal connector; a cage for guiding the signal connector towards the interface; and a heat sink. The cage comprises a cage portion that is configured to move from a first position to a second position upon insertion of the signal connector into the cage. In the first position, the cage portion is not in thermal contact with the heat sink; when in the second position, the cage portion is in thermal contact with the heat sink.

Another aspect of the disclosure provides an apparatus comprising one or more interface modules as defined above.

BRIEF DESCRIPTION OF THE DRAWINGS

For a better understanding of examples of the present invention, and to show more clearly how the examples may be carried into effect, reference will now be made, by way of example only, to the following drawings in which.

DETAILED DESCRIPTION

Figure 2:
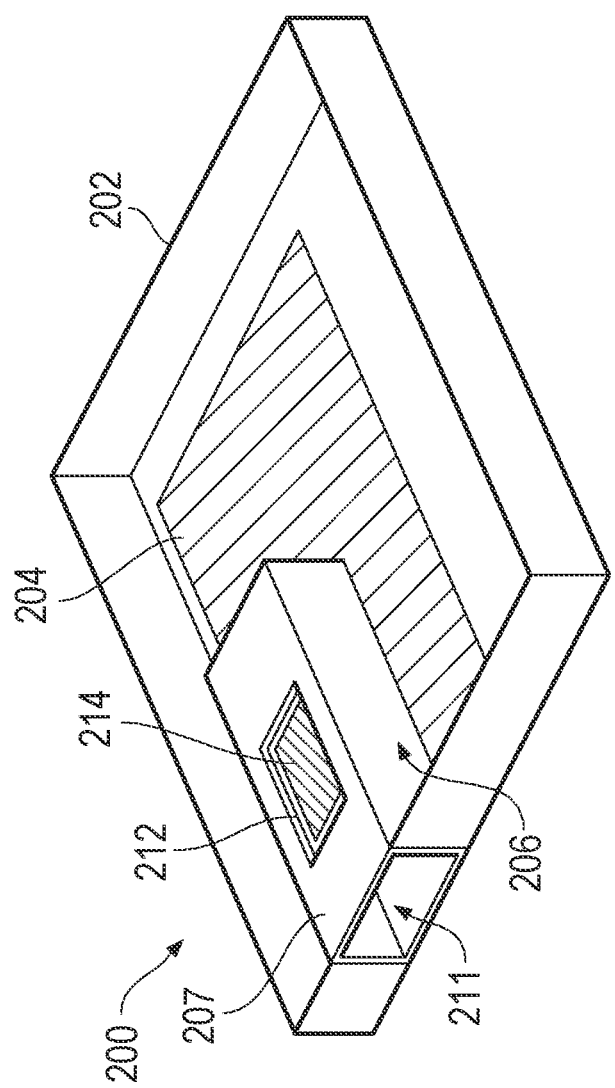
FIG. 2 is a schematic drawing of an interface module according to embodiments of the disclosure.

FIG. 2 shows an interface module 200 according to embodiments of the disclosure. The interface module 200 may be suitable for use in a computerized or processing apparatus, such as a networked computer, server or a network node for a telecommunications network.

The module 200 comprises a housing 202 that surrounds and substantially encloses the components within the module 200. The housing 202 may be manufactured from any suitably robust material, so as to provide structural support for the components inside the module 200, and protection from damage and the ingress of dust and dirt, etc. According to embodiments of the disclosure, the material for the housing 202 may also be chosen such that the housing 202 acts as a thermal conductor (i.e. the material may have a relatively high coefficient of thermal conduction). For example, the housing 202 may be manufactured from a metal, such as aluminium, steel sheet metal, copper sheet metal, or in general any other thermally conductive material.

In FIG. 2, the upper part of the housing 202 is not shown so as to show the internal components of the module 200. The module thus comprises a substrate 204, such as a printed circuit board (PCB) 204, that is affixed to an internal surface of the housing 202.

Mounted on the PCB is a receptacle or cage 206 for a connector. Further detail of the cage 206 can be seen in FIG. 3a.

The cage 206 is substantially hollow, and comprises an opening 211 at one end, a rear face at an end that is opposite to the opening, and a cage body 207 extending between the opening and the rear face. An interface 208 (seen in FIG. 3a) is positioned within the cage, towards, adjacent or at the rear face of the cage. The interface 208 extends through the base of the cage 206, and provides a connection to circuitry in the PCB 204. The interface 208 may possess a shape and structure that is complementary to a corresponding shape and structure of a connector, such that the connector mates with the interface 208 upon complete insertion of the connector into the cage 206. In some aspects, the module 200 comprises one or more interfaces 208, and optionally comprises further components, e.g. processing circuitry (e.g. in PCB 204) which may be common or individual to the one or more interfaces 208. The housing 202 is configured to extend over the one or more interfaces 208 and further components.

The opening 211 of the cage is aligned with a corresponding opening in the housing 202, such that a connector can be inserted from outside the module 200, through the opening 211, and into the cage 206. Upon complete insertion of the connector in the cage 206, the connector mates with the interface 208 to form a signal connection with the PCB 204. Input and output signals (such as electrical or optical signals) can thus be passed between the connector (and its corresponding cable) and the PCB 204.

In one embodiment, the cage 206 defines an internal volume which, together with the opening 211, possesses a cross-sectional shape that complements the cross-sectional shape of the connector. The cage 206 thus guides the connector towards the interface 208 and ensures an accurate and repeatable connection between the connector and the interface 208.

In the illustrated embodiment, the cage 206 has a rectangular cross-section, and the corresponding internal volume is also rectangular in cross-section (so as to match a corresponding rectangular cross-section of a connector). The cage body 207 thus comprises a substantially flat upper surface, and substantially flat sidewalls running between the upper surface and the PCB 204. The cage body 207 may also comprise a base lying in contact with the PCB 204; however, in other embodiments the cage body 207 may not have a base. Those skilled in the art will also appreciate that, in other embodiments, the cage may take a different shape (e.g. so as to match a corresponding shape of a connector).

According to embodiments of the disclosure, the cage 206 further comprises a portion (called herein a "floating portion") 212 located in the upper surface of the cage body 207. The floating portion 212 may be movable with respect to the cage body 207. In the illustrated embodiment, the floating portion 212 comprises a plate that is separated from the upper surface of the cage body 207 along three edges thereof. At these three edges (i.e. two side edges and a third edge that is distal to the opening 211), the floating portion is not coupled to the cage body 207. At the edge 216 closest to the opening 211, the floating portion is coupled to the cage body, such that the portion 212 acts as a flap and is able to move up and down relative to the body 207, i.e. into and out of the space defined by the cage 206 for receiving the connector. In some examples, the floating portion 212 is integrally formed with a remainder of the cage body 207. In alternative embodiments, the floating portion 212 may comprise a separate material that is connected to the cage body 207 in a substantially similar manner, along an edge or connection 216.

The example described refers to the floating portion 212 as being located in an upper surface of the cage body. In some aspects, the floating portion may be located in a surface of the cage body adjacent to, parallel to, or facing, an area of the housing. The module 200 may be orientated so that the surface in which the floating portion is located is facing vertically, horizontally or at an angle to vertical.

Figure 3A:
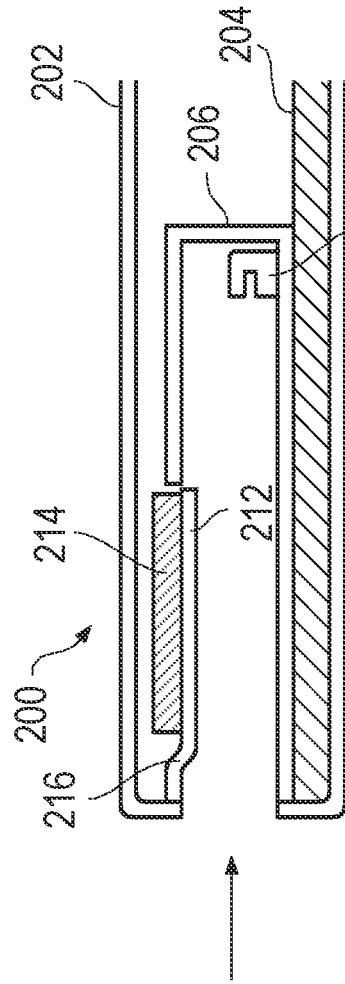
FIGS. 3a to 3c show the insertion of a connector into the interface module according to embodiments of the disclosure.

In FIGS. 2 and 3a, the floating portion 212 is shown at a location within the internal volume of the cage 206. For example, according to embodiments of the disclosure, the floating portion 212 may extend approximately 1 mm into the internal volume defined by the cage 206. The floating portion 212 may be biased towards this position (e.g. through the resilience of the material forming the floating portion and particularly the connection 216 to the cage body). Upon insertion of a connector into the cage 206, however, the floating portion is urged upwards, out of or away from the internal volume of the cage 206. The floating portion 212 is urged out of the internal volume of the cage 206 by physical contact with the connector, i.e. as the connector is inserted. For example, if the cage defines an axis representing the direction of insertion of the connector (i.e. from the opening 211 to the interface 208), the floating portion 212 is urged in a direction away from the axis, e.g. substantially laterally away from the axis.

According to embodiments of the disclosure, a layer of thermal interface material 214 may be provided on an outer surface of the floating portion 212. The thermal interface material 214 may be any material suitable for the transfer of thermal energy (i.e. a material having very high thermal conductivity). However, for reasons that will be apparent from the disclosure below, the thermal interface material should not have strong adhesive properties. Suitable materials for this purpose include thermal grease, thermal gap filler, or a thermal pad.

Figure 3B:
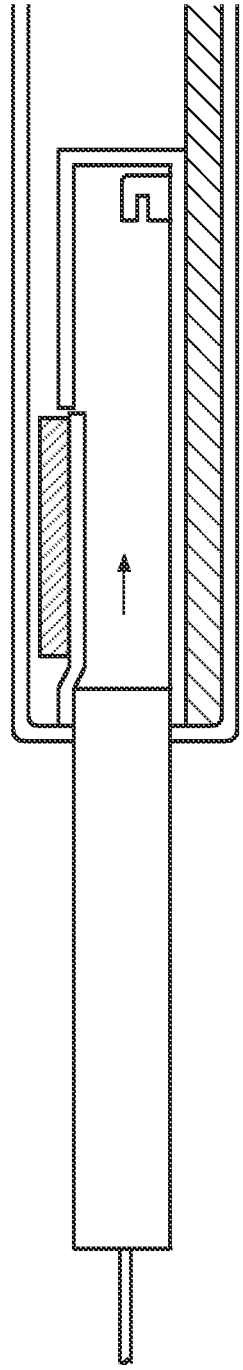
Figure 3C:
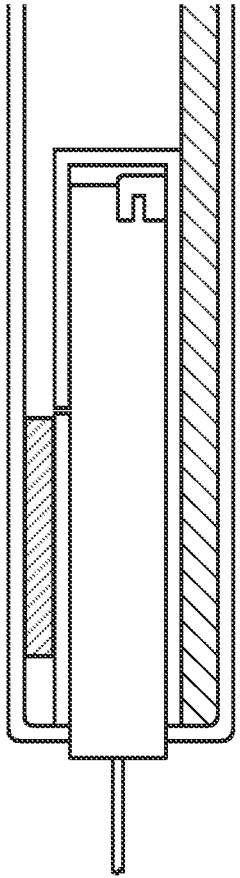

FIGS. 3a to 3c show the insertion of a connector 250 into the interface module 200 according to embodiments of the disclosure.

The connector 250 may form part of a cable assembly, comprising a cable with two plug connectors positioned at either end. The cable assembly may be configured to transfer optical or electrical signals to or from the interface module 200, and thus the interface 208 and associated circuitry in the PCB 204 may be configured to convert optical signals to corresponding electrical signals and vice versa, or to transfer electrical signals from the PCB 204 to the connector 250 and vice versa. The connector 250 may take any form, including small form factor pluggable (SFP), quad SFP (QSFP), C form-factor pluggable (CFP) and XSP connectors.

In FIG. 3a, while at rest, the floating portion 212 lies at least partially within the internal volume of the cage 206. In this position, a distance between the floating portion 212 and a base surface of the cage is smaller than a corresponding dimension (e.g. height) of the connector. In some aspects, a distance between the floating portion 212 and a base surface of the cage is smaller than a corresponding dimension (e.g. height) of the opening of the cage.

In FIG. 3b, the connector 250 is inserted through the opening 211 of the cage 206, and engages with the floating portion 212. In particular, the connector 250 first engages with the edge 216 that extends down from the cage body 207 into the internal volume.

The internal volume has a cross-sectional shape that complements the cross-sectional shape of the connector 250. Thus the floating portion 212 is pushed outwardly (that is, away from the direction of motion of the connector 250) by further insertion of the connector 250 into the cage, against the biasing provided by the resilience of the material used in the edge 216.

In FIG. 3c, the connector 250 is shown entirely inserted into the cage 206, and coupled to the interface 208. The floating portion 212 is pushed outwards from the internal volume, such that the layer of thermal interface material 214 comes into thermal contact with the housing 202. In this configuration, the connector 250 is thus provided with a thermal interface with the housing 202, which can then act as a heat sink for the heat that builds up in the connector 250 during use. In some embodiments, a further layer of thermal interface material may be provided on the housing 202, such that the layer 214 comes into contact with the further layer of thermal interface material rather than the housing directly. In either configuration, no separate heat sink is required in the interface module, as the housing provides the necessary dissipation of heat. Thus, when the connector is fully inserted into the cage, the connector and housing are in good thermal contact, via the floating portion, i.e. the connector and floating portion, and the floating portion and housing, are in direct physical contact. This provides for dissipation of heat from the connector to the housing, via the floating portion, and subsequent dissipation from the housing to the surrounding environment.

Those skilled in the art will appreciate that the precise dimensions of the connector system described above, as well as the materials used, etc, may be varied so as to provide an optimal compromise between ease of use and thermal transfer efficiency.

For example, the engagement of the connector 250 with the floating portion 212 (i.e. upon initial insertion) will inevitably provide some resistance to the further insertion of the connector into the cage 206. By coupling the floating portion to the cage body at an edge 216 that is proximal to the opening 211 of the cage (e.g. and so that the edge 216 is angled with respect to the direction of motion of the connector 250), the force required to insert the connector 250 can be reduced.

Further, the thickness of the thermal transfer material layer 214, the distance of the cage from the inner surface of the housing 202, and the tolerance of the connector 250 within the cage 206 (i.e. the extent to which the connector is able to move in a direction lateral to the direction of insertion) can all be varied so as to alter the efficiency of the thermal interface with the housing 202 (i.e. altering the force with which the floating portion is urged into contact with the housing) and the ease with which the connector can be inserted into the cage. In general, the easier it is to insert the connector 250, the less efficient the thermal interface will be with the housing 202. In practice, a compromise is needed between these two requirements.

Figure 1:
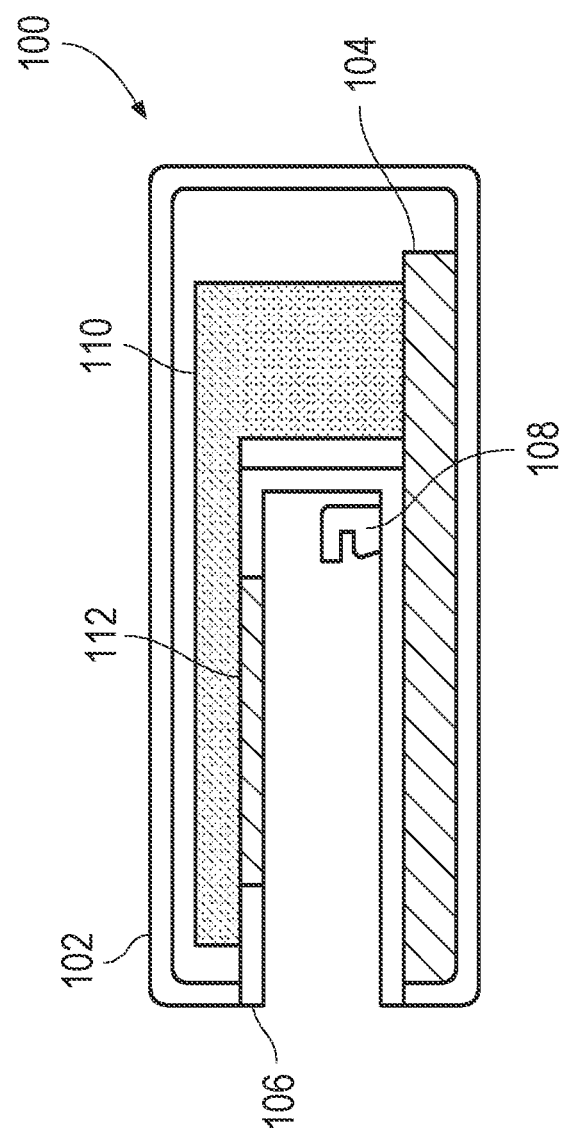
FIG. 1 is a schematic drawing of a conventional interface module in cross section.

Those skilled in the art will appreciate that connector systems may vary from the precise illustrated embodiments without departing from the scope of the claims appended hereto. For example, in the illustrated embodiments, the housing 202 acts as a heat sink, and no additional heat sink is provided within the housing 202. However, in other embodiments of the disclosure, a separate heat sink may be provided. In these embodiments, rather than being urged into thermal contact with the housing 202, the floating portion 212 is urged into engagement with the heat sink (which may take a similar form to that shown in FIG. 1). The floating portion still provides an efficient mechanism for achieving good thermal contact between an inserted connector and a heat sink.

Further, only a single PCB 204 is shown in the illustration, with a single cage 206. However, it will be appreciated that the interface module 200 may comprise multiple PCBs and/or multiple cages. That is, a single PCB may be connected to one or more cages, and more than one PCB may be provided in a single interface module. In these embodiments, a single housing may be provided encasing (and providing a heat sink for) multiple cages. Alternatively, one or more separate heat sinks may be provided for the cages.

Figure 4:
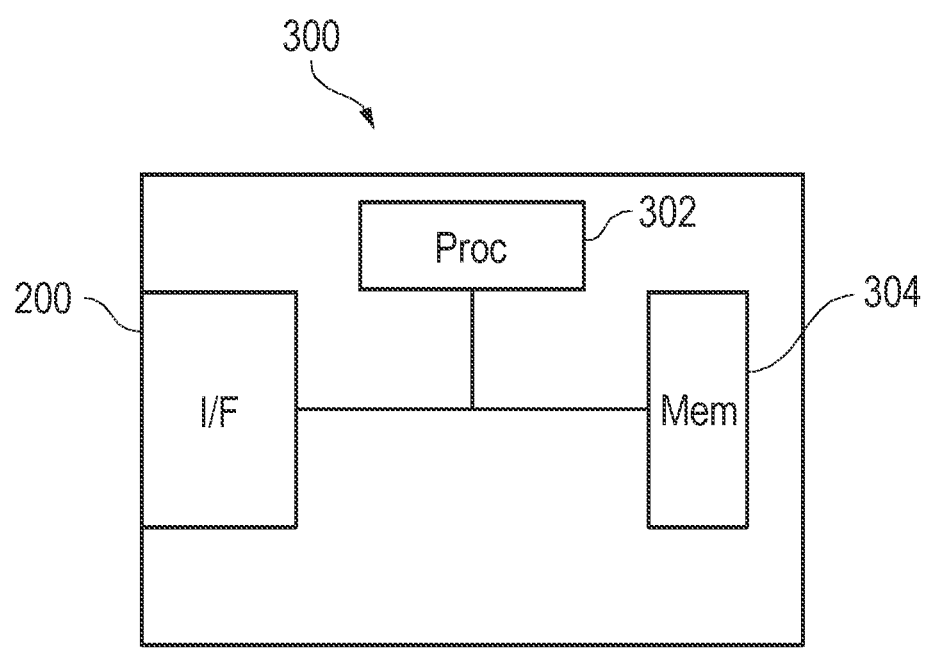
FIG. 4 shows an apparatus according to embodiments of the disclosure.

FIG. 4 shows an apparatus 300 according to embodiments of the disclosure. In the illustrated embodiment, the apparatus 300 is a computing apparatus (e.g. a computer, or server). In other embodiments, however, the apparatus may be any device that receives or transmits input or output signals (whether electric signals or optical signals), and thus has need of an input/output connector system. For example, the apparatus may be a node within a telecommunications network. In some examples, the apparatus comprises one or more, e.g. a plurality of, interface modules as described. In some aspects, the housing 202, acting as the heat sink, is common to the plurality of interface modules.

The apparatus 300 comprises processing circuitry 302, and a computer-readable medium 304 (such as memory) coupled to the processing circuitry 302. The apparatus further comprises one or more interface module 200, as described above with respect to FIGS. 2 and 3a to 3c, coupled to the processor circuitry 302 and the memory 304. The interface module 200 provides one or more input/output connections to external devices or network components, via a cable assembly. Thus signals received via the interface module 200 can be passed to the processor circuitry 302 for demodulation, while the processor circuitry 302 can generate and transmit signals via the interface module 200.

As described above, heat sinks (such as that included in or provided by the housing 202) are used in connector systems to dissipate excess heat that may build up whilst a connector is in use. Systems with a high density of optical and electronic components can generate large amounts of heat, which can lead to the components being subject to thermal stress. Pluggable optical and electronic modules are particularly affected, as they often contain embedded components that generate a large amount of heat. This can be a particular issue when components that draw a large amount of power (e.g. 15 Watts or more) are included, as mechanical cooling methods may no longer be sufficient to dissipate the generated heat. Therefore, more effective cooling mechanisms are required for connector systems.

Figure 5:
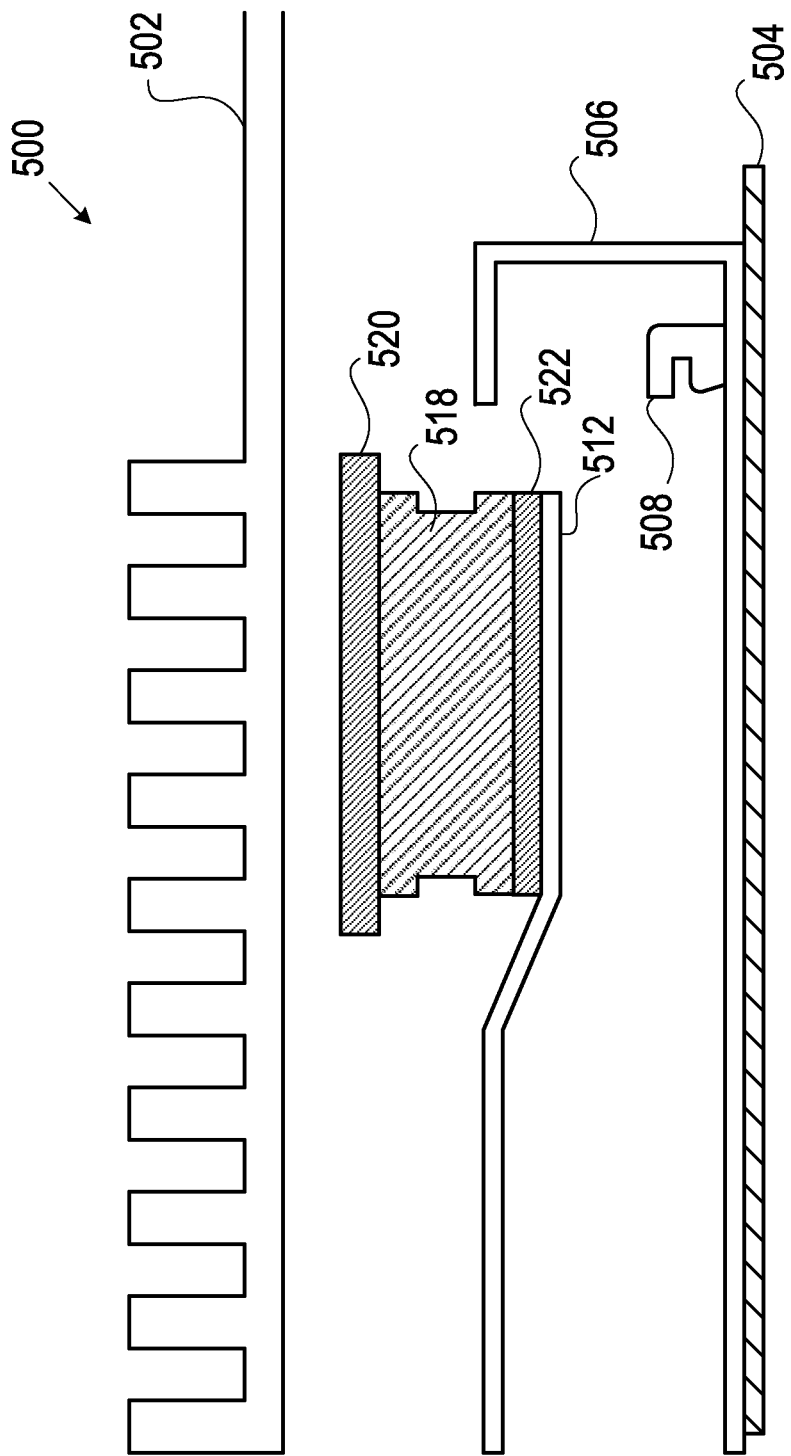
FIG. 5 is a schematic drawing of an interface module according to embodiments of the disclosure.

Accordingly, FIG. 5 shows an interface module 500 according to further embodiments of the disclosure.

Corresponding to the module 200 described above with respect to FIGS. 2 and 3a to 3c, the module 500 comprises a substrate 504 (which may be a PCB) upon which a receptacle or cage 506 is mounted. An interface 508 is positioned within the cage, extending through the base of the cage 506 to provide a connection to circuitry in the substrate 504. Upon insertion of a connector into the cage 506, the connector mates with the interface 508 to form a signal connection with the substrate 504. Input and output signals (such as electrical or optical signals) can thus be passed between the connector (and its corresponding cable) and the substrate 504.

The cage 506 comprises a cage portion (called herein the "floating portion") 512, corresponding to the floating portion 212 described above in relation to FIGS. 2 and 3a to 3c. Therefore, as described for the floating portion 212, the floating portion 512 is movable from a first position in which the floating portion 512 lies at least partially within the internal volume of the cage 506 to a second position in which the floating portion is pushed outwards from the internal volume of the cage 506. The floating portion 512 moves from this first position to the second position when a connector is fully inserted into the cage 506.

In addition to the interface module 200 described above in relation to FIGS. 2 and 3a to 3c, the interface module 500 further comprises a thermoelectric cooling device 518 (e.g., a Peltier device) between the cage portion 512 and a heat sink 502. A current may be applied across the thermoelectric cooling device 518 to transfer heat from the cage portion 512 to the heat sink 502 when the thermoelectric cooling device 518 is in thermal contact with the heat sink 502 and the cage portion 512. As such, the thermoelectric cooling device 518, e.g. a Peltier device, is an active device which requires a power supply. The thermoelectric cooling device 518 provides an increased transfer of heat to the heat sink. The thermoelectric cooling device 518 may alternatively be termed a thermoelectric heat pump, thermoelectric cooler or solid-state active heat pump.

In the example of the thermoelectric cooling device 518 being a Peltier device, the thermoelectric cooling device 518 is configured and functions according to the known operations of a Peltier device in order to transfer heat to the heat sink. The Peltier device may alternatively be known as a Peltier heat pump or Peltier cooler. Examples utilize the Peltier effect to provide increased heat transfer from the floating portion 512 to the heat sink, compared to a passive thermal connection.

In the illustrated embodiment, the thermoelectric cooling device 518 is directly coupled to the floating portion 512 so that the thermoelectric cooling device 518 rests on the cage portion 512. The module 500 further comprises a first layer of thermal interface material 520 between the thermoelectric cooling device 518 and the heat sink 502. The first layer of thermal interface material 520 functions as a gasket to provide a good thermal contact between the thermoelectric cooling device 518 and the heat sink 502. In the example shown, the first layer of thermal interface material 520 is affixed to the thermoelectric cooling device 518 in the illustrated embodiment, and is then moved into physical contact with the heat sink by movement of the floating portion 512 into the second position. In an alternative example, the first layer of thermal interface material 520 is affixed to the heat sink 502. In this case, the thermoelectric cooling device 518 is moved into physical contact with the first layer of thermal interface material 520 (affixed to the heat sink) by movement of the floating portion 512 into the second position.

The first layer of thermal interface material 520 may be similar in construction and function to the thermal interface material 214 described above in relation to FIGS. 3a to 3c. Thus, the thermal interface material 520 may be any material suitable for the transfer of thermal energy (i.e. a material having very high thermal conductivity). The thermal interface material 520 may take the form of a gasket or seal that provides an effective thermal interface between the thermoelectric cooling device 518 and the heat sink 502.

Thus, when the floating portion 512 is moved from the first position to the second position (e.g. when a connector is fully inserted into the cage 506), the thermoelectric cooling device 518 is brought into thermal contact with heat sink 502 via the first layer of thermal interface material 520. Accordingly, when a connector is fully inserted into the cage 506, the connector and the heat sink 502 are in thermal contact via the floating portion 512, the thermoelectric cooling device 518 and the first layer of thermal interface material 520. Heat from the connector may thus be efficiently transferred to the heat sink 502 by the thermoelectric cooling device 518, allowing the connector to be cooled more effectively.

A second layer of thermal interface material 522 may be positioned between the thermoelectric cooling device 518 and the floating portion 512. The second layer of thermal interface material 522 may be in addition to, or instead of the first layer of thermal interface material 520. For example, the first layer of the thermal interface material 520 may be omitted, and the second layer of thermal interface material 522 may be positioned between the floating portion 512 and the thermoelectric cooling device 518. Alternatively, the module 500 may be provided with first and second layers of thermal interface material positioned between the heat sink 502 and the thermoelectric cooling device 518, and the thermoelectric cooling device 518 and the floating portion 512 respectively.

The application of the first and/or second layers of thermal interface material may provide a more effective thermal interface between the heat sink 502 and the thermoelectric cooling device 518, and/or the thermoelectric cooling device 518 and the floating portion 512 respectively. In particular, the use of one or more layers of thermal interface material may minimise the presence of air pockets or gaps between the heat sink 502, thermoelectric cooling device 518 and the floating portion 512, providing a closer fit, and therefore more efficient thermal interface, between these parts of the module 500.

In alternative embodiments, the first and second layers of the thermal interface material may be omitted entirely. In such embodiments, when a connector is inserted and the floating portion 512 is in the second position, the connector and floating portion 512, and the floating portion 512 and the thermoelectric cooling device 518, are in direct physical contact.

In some aspects, which may be combined with any example embodiment, the thermoelectric cooling device 518 is affixed to the heat sink 502. The movement of the floating portion 512 to the second position moves the floating portion 512 into thermal contact with the thermoelectric cooling device 518. The thermal contact may be via physical contact with a second layer of the thermal interface material affixed to the floating portion 512 and/or heat sink 502.

In the illustrated embodiment, the heat sink 502 comprises a plurality of fins designed to dissipate heat. However, those skilled in the art will appreciate that the heat sink 502 may take any suitable shape or form. In some embodiments, the heat sink 502 may be provided as part of a housing that substantially encloses and surrounds the internal components of the module 500 (e.g., such that the housing itself acts as a heat sink as described above with respect to FIG. 2). Alternatively, as in the embodiment illustrated in FIG. 5, the heat sink 502 may be provided as a separate component.

Embodiments of the disclosure thus provide an efficient mechanism for the dissipation of heat in an input/output connector system. The cage or receptacle of a connector system is provided with a floating portion that is movable, upon insertion of a connector into the cage, into engagement with a heat sink. The connector is thus placed into reliable, efficient thermal contact with the heat sink, without requiring multiple components (such as spring clips, etc) to bring the connector and heat sink together. In some embodiments, the housing of the interface module, in which the connector system is located, can act as a heat sink itself. In these embodiments, a separate, dedicated heat sink is therefore not required and a considerable space saving in the interface module results.

The above disclosure sets forth specific details, such as particular embodiments or examples for purposes of explanation and not limitation. It will be appreciated by one skilled in the art that other examples may be employed apart from these specific details.

The invention claimed is:

1. An interface module, comprising:
an interface for connection with a signal connector;
a cage for guiding the signal connector towards the interface;
a heat sink;
a thermoelectric cooling device between the cage portion and the heat sink; and
the cage comprising a cage portion that is configured to move from a first position to a second position upon insertion of the signal connector into the cage, when in the first position, the cage portion is not in thermal contact with the heat sink, and when in the second position, the cage portion is in thermal contact with the heat sink; and
the cage, the thermoelectric cooling device and heat sink being arranged such that when the cage portion is in the first position, the thermoelectric cooling device is in thermal contact with only one of the cage portion and the heat sink, and when the cage portion is in the second position, the thermoelectric cooling device is in thermal contact with both the heat sink and the cage.

2. The interface module according to claim 1, wherein the cage defines an internal volume and wherein, when in the first position, the cage portion extends into the internal volume.

3. The interface module according to claim 2, wherein the cage portion is configured such that insertion of the signal connector urges the cage portion outwardly from the internal volume towards the second position.

4. The interface module according to claim 1, wherein the cage portion is biased towards the first position.

5. The interface module according to claim 4, wherein the cage portion is biased towards the first position by means of a resilient connection between the cage portion and the cage.

6. The interface module according to claim 1, wherein the cage further comprises a cage body, and wherein the cage portion is coupled to the cage body and movable relative to the cage body.

7. The interface module according to claim 6, wherein the cage portion is coupled to the cage body via one edge of the cage portion, with the remaining edges of the cage portion unconnected to the cage body.

8. The interface module according to claim 7, wherein the one edge coupling the cage portion to the cage body is an edge that is proximal to an opening of the cage through which the signal connector is insertable.

9. The interface module according to claim 8, wherein the interface is located towards a distal end of the cage relative to the opening.

10. The interface module according to claim 1, wherein the cage portion comprises a first layer of thermal interface material.

11. The interface module according to claim 1, wherein the heat sink comprises a housing of the interface module.

12. The interface module according to claim 1, wherein the signal connector consists of one of: an optical connector, an electrical connector, or an electro-optic connector.

13. The interface module according to claim 1, wherein the signal connector consists of a small form-factor pluggable, SFP, connector.

14. The interface module according to claim 1, further comprising a first layer of thermal interface material between the thermoelectric cooling device and the cage portion.

15. The interface module according to claim 1, further comprising a second layer of thermal interface material between the thermoelectric cooling device and the heat sink.

16. An apparatus comprising at least one interface module, each of the at least one interface modules comprising:
an interface for connection with a signal connector;
a cage for guiding the signal connector towards the interface;
a heat sink;
a thermoelectric cooling device between the cage portion and the heat sink; and
the cage comprising a cage portion that is configured to move from a first position to a second position upon insertion of the signal connector into the cage, when in the first position, the cage portion is not in thermal contact with the heat sink, and when in the second position, the cage portion is in thermal contact with the heat sink; and
the cage, the thermoelectric cooling device and heat sink being arranged such that when the cage portion is in the first position, the thermoelectric cooling device is in thermal contact with only one of the cage portion and the heat sink, and when the cage portion is in the second position, the thermoelectric cooling device is in thermal contact with both the heat sink and the cage.

17. An apparatus comprising:
a plurality of interface modules;
a heat sink;
a thermoelectric cooling device between the cage portion and the heat sink; and
each of the plurality of interface modules comprising:
an interface for connection with a signal connector;
a cage for guiding the signal connector towards the interface, each cage comprising a cage portion that is configured to move from a first position to a second position upon insertion of the signal connector into the cage, when in the first position, the cage portion is not in thermal contact with the heat sink, and when in the second position, the cage portion is in thermal contact with the heat sink; and the cage, the thermoelectric cooling device and heat sink being arranged such that when the cage portion is in the first position, the thermoelectric cooling device is in thermal contact with only one of the cage portion and the heat sink, and when the cage portion is in the second position, the thermoelectric cooling device is in thermal contact with both the heat sink and the cage.

* * * * *